(12) United States Patent
Wu et al.

(10) Patent No.: US 11,573,277 B2
(45) Date of Patent: Feb. 7, 2023

(54) ELECTROMAGNETIC PROPERTY MEASURING DEVICE, ELECTROMAGNETIC PROPERTY MEASURING SYSTEM AND ELECTROMAGNETIC PROPERTY MEASURING METHOD

(71) Applicant: Industrial Technology Research Institute, Hsinchu (TW)

(72) Inventors: Chun-Pin Wu, Tainan (TW); Shi-Yuan Tong, Hsinchu County (TW); Mean-Jue Tung, Kinmen County (TW)

(73) Assignee: Industrial Technology Research Institute, Hsinchu (TW)

( * ) Notice: Subject to any disclaimer, the term of this patent is extended or adjusted under 35 U.S.C. 154(b) by 45 days.

(21) Appl. No.: 17/126,025

(22) Filed: Dec. 18, 2020

(65) Prior Publication Data
US 2021/0190887 A1 Jun. 24, 2021

Related U.S. Application Data

(60) Provisional application No. 62/949,458, filed on Dec. 18, 2019.

(51) Int. Cl.
*G01R 33/12* (2006.01)

(52) U.S. Cl.
CPC .................. *G01R 33/1223* (2013.01)

(58) Field of Classification Search
CPC ............. G01R 33/00; G01R 33/0035; G01R 33/0023; G01R 33/0017; G01R 31/3191; G01R 33/1223; G01B 7/004; G01C 17/38; G06F 3/017; G06F 3/0346; G06F 3/012
See application file for complete search history.

(56) References Cited

U.S. PATENT DOCUMENTS

| 5,153,796 A | * | 10/1992 | Gooch ............... G01R 33/00 |
| 5,537,036 A | | 7/1996 | Sato et al. |
| 8,476,896 B2 | | 7/2013 | Mednikov |
| 9,568,568 B2 | | 2/2017 | Ebnabbasi et al. |

(Continued)

FOREIGN PATENT DOCUMENTS

| CN | 1214522 | 4/1999 |
| CN | 103744039 | 4/2014 |

(Continued)

OTHER PUBLICATIONS

"Office Action of Japan Counterpart Application", dated Feb. 8, 2022, p. 1-p. 2.
S. Yabukami, et al., "Permeability Measurements of Thin Film Using a Flexible Microstrip Line-Type Probe Up to 40 GHz", Journal of the Magnetics Society of Japan vol. 41 Issue 2, Jan. 10, 2017, pp. 25-28.

(Continued)

*Primary Examiner* — Jermele M Hollington
*Assistant Examiner* — Taqi R Nasir
(74) *Attorney, Agent, or Firm* — JCIPRNET

(57) ABSTRACT

An electromagnetic property measuring device includes a magnetic conductive structure, a coil, and a scattering parameter measuring unit. The magnetic conductive structure includes a first side facing a sample to be tested and a second side opposite to the first side, and the first side has a magnetic gap. The coil surrounds the magnetic conductive structure to generate a magnetic field with the magnetic conductive structure. The scattering parameter measuring unit is disposed at the first side and located within a range of the magnetic field.

20 Claims, 12 Drawing Sheets

(56) References Cited

U.S. PATENT DOCUMENTS

| | | | |
|---|---|---|---|
| 2013/0049751 A1* | 2/2013 | Hamberger | G01R 33/072 324/253 |
| 2018/0313666 A1 | 11/2018 | Mednikov et al. | |
| 2018/0335317 A1 | 11/2018 | Turner | |

FOREIGN PATENT DOCUMENTS

| | | | | |
|---|---|---|---|---|
| CN | 106971815 | | 7/2017 | |
| CN | 109884565 | | 6/2019 | |
| CN | 110487889 | | 11/2019 | |
| JP | H02311776 | | 12/1990 | |
| JP | 2003121419 | | 4/2003 | |
| JP | 2003121419 A | * | 4/2003 | G01R 33/12 |
| JP | 2008014920 | | 1/2008 | |
| JP | 2012032165 | | 2/2012 | |
| JP | 2012032165 A | * | 2/2012 | G01R 33/12 |
| JP | 2016053569 | | 4/2016 | |
| JP | 6362249 | | 7/2018 | |
| TW | I530679 | | 4/2016 | |
| TW | I668714 | | 8/2019 | |

OTHER PUBLICATIONS

K. Kusunoki, et al., "Permeability Measurements of Very Thin Magnetic Film Using a Flexible Microstrip-Line-Type Probe", Journal of the Magnetics Society of Japan vol. 39 Issue 3, Mar. 3, 2015, pp. 111-115.

Shin Yabukami, et al., "Thin Film Permeability Evaluation Based on Skin Effect Using Meander-Type Probe Up to 10.6 GHz", IEEE Transactions on Magnetics, vol. 47, No. 10, Oct. 2011, pp. 2570-2572.

S. Takeda, et al., "Wideband Measurement System of $\Delta H\omega$ using All Shielded Shorted Microstrip Line", Journal of the Magnetics Society of Japan vol. 33 Issue 3, Mar. 4, 2009, pp. 171-174.

S. Takeda, et al., "Permeability Measurements of Magnetic Thin Films using Shielded Short-Circuited Microstrip Lines", Journal of the Magnetics Society of Japan vol. 39 Issue 6, Aug. 21, 2015, pp. 227-231.

"Office Action of Taiwan Counterpart Application", dated Aug. 31, 2021, p. 1-p. 10.

* cited by examiner

ELECTROMAGNETIC PROPERTY MEASURING DEVICE, ELECTROMAGNETIC PROPERTY MEASURING SYSTEM AND ELECTROMAGNETIC PROPERTY MEASURING METHOD

CROSS-REFERENCE TO RELATED APPLICATION

This application claims the priority benefit of U.S. Provisional Application No. 62/949,458, filed on Dec. 18, 2019. The entirety of the above-mentioned patent application is hereby incorporated by reference herein and made a part of this specification.

TECHNICAL FIELD

The disclosure relates to a measuring device, a measuring system, and a measuring method and particularly relates to an electromagnetic property measuring device, an electromagnetic property measuring system, and an electromagnetic property measuring method.

DESCRIPTION OF RELATED ART

With the rapid development of communication and semiconductor technologies, components, memories, and other relevant devices such are being developed toward miniaturization and slimness, ultra-wideband, controllable loss, and so forth, and magnetic materials have been increasingly applied in electronic apparatus, circuit devices, and memories, e.g., in magnetic devices including inductors, sensors, interference suppressors, high density magnetic recording and reproducing heads, magnetic memories, electromagnetic wave interference (EMI) protection devices, smart surfaces, device packages, advanced driver assistance system (ADAS), transceiver antenna, or the like. The prerequisites for the development and application of these magnetic materials are to accurately know the basic electromagnetic properties of the magnetic material, so as to effectively conduct simulated design and development. As such, it is of great significance to be able to accurately measure electromagnetic properties of the magnetic materials.

The existing electromagnetic property measuring methods include a coaxial method, a waveguide method, and a cavity resonator perturbation method. All these methods, however, impose strict limitations on the size of samples, and therefore the materials are required to be reproduced to samples of the specific size. Since the electromagnetic properties of the samples are often associated with the actual application size, the properties of the reproduced samples are different from the properties of the original materials. Hence, the electromagnetic properties measured by applying the existing methods are different from the actual application, which easily leads to erroneous determination of the properties of the materials and ineffective design simulation. Besides, the conventional technology cannot be applied for large-area measurement, which easily results in the time-consuming development of materials, devices, and relevant application devices and significantly increases the costs.

SUMMARY

The disclosure provides an electromagnetic property measuring device, an electromagnetic property measuring system, and an electromagnetic property measuring method, which can directly measure electromagnetic properties of an actual sample without cutting or reproducing the sample; as such, verification requirements for materials, devices, and corresponding application devices may be correspondingly developed.

In an embodiment of the disclosure, an electromagnetic property measuring device includes a magnetic conductive structure, a coil, and a scattering parameter measuring unit. The magnetic conductive structure includes a first side facing a sample to be tested and a second side opposite to the first side, wherein the first side has a magnetic gap. The coil surrounds the magnetic conductive structure to generate a magnetic field with the magnetic conductive structure. The scattering parameter measuring unit is disposed at the first side and located within a range of the magnetic field.

In an embodiment of the disclosure, an electromagnetic property measuring system includes the electromagnetic property measuring device, an analyzing unit, and a control unit. The analyzing unit is coupled to the electromagnetic property measuring device to analyze electromagnetic properties of the sample. The control unit is coupled to the electromagnetic property measuring device and the analyzing unit to control the electromagnetic property measuring device to measure a surface of the sample.

In an embodiment of the disclosure, an electromagnetic property measuring method includes following steps. The electromagnetic property measuring device is provided. The electromagnetic property measuring device is placed to contact a first measuring point on the surface of the sample. Currents of different intensities are supplied to the electromagnetic property measuring device to generate magnetic fields of different intensities, and scattering parameters correspondingly generated by the sample to be tested are measured. Electromagnetic properties of the sample to be tested on the first measuring point are measured according to the scattering parameters. The electromagnetic property measuring device is moved to a second measuring point on the surface.

Based on the above, the electromagnetic property measuring device provided in the disclosure has the magnetic gap at the first side facing the sample, so that the magnetic field may be guided to the first side. Accordingly, the first side of the electromagnetic property measuring device faces the sample to be tested and may then move on the surface of the sample to be tested for measurement within a large area. Therefore, it is not necessary for the electromagnetic property measuring device provided in the disclosure to cut or trim the sample to be tested to a specific size to be accommodated between two magnetic field structures; instead, the electromagnetic property measuring device may move directly on the surface of the sample to be tested to measure the sample that remains intact, thus mitigating the impact of shape on the electromagnetic properties. As a result, the electromagnetic property measuring device provided in the disclosure may effectively improve the measurement accuracy of the electromagnetic properties of the sample to be tested (especially a sample occupying a large area or a sheet-like sample).

DESCRIPTION OF THE EMBODIMENTS

The foregoing and other technical contents, features, and effects of the disclosure will be clearly presented in the following detailed description of each embodiment with reference to the drawings. The directional terms mentioned in the following embodiments, for example: "up", "down", "front", "rear", "left", "right", etc., are just directions for referring to the attached drawings. Therefore, the directional terms used are used to illustrate, not to limit the disclosure. In addition, in the following embodiments, the same or similar elements will be represented by the same or similar reference numbers.

Figure 1:
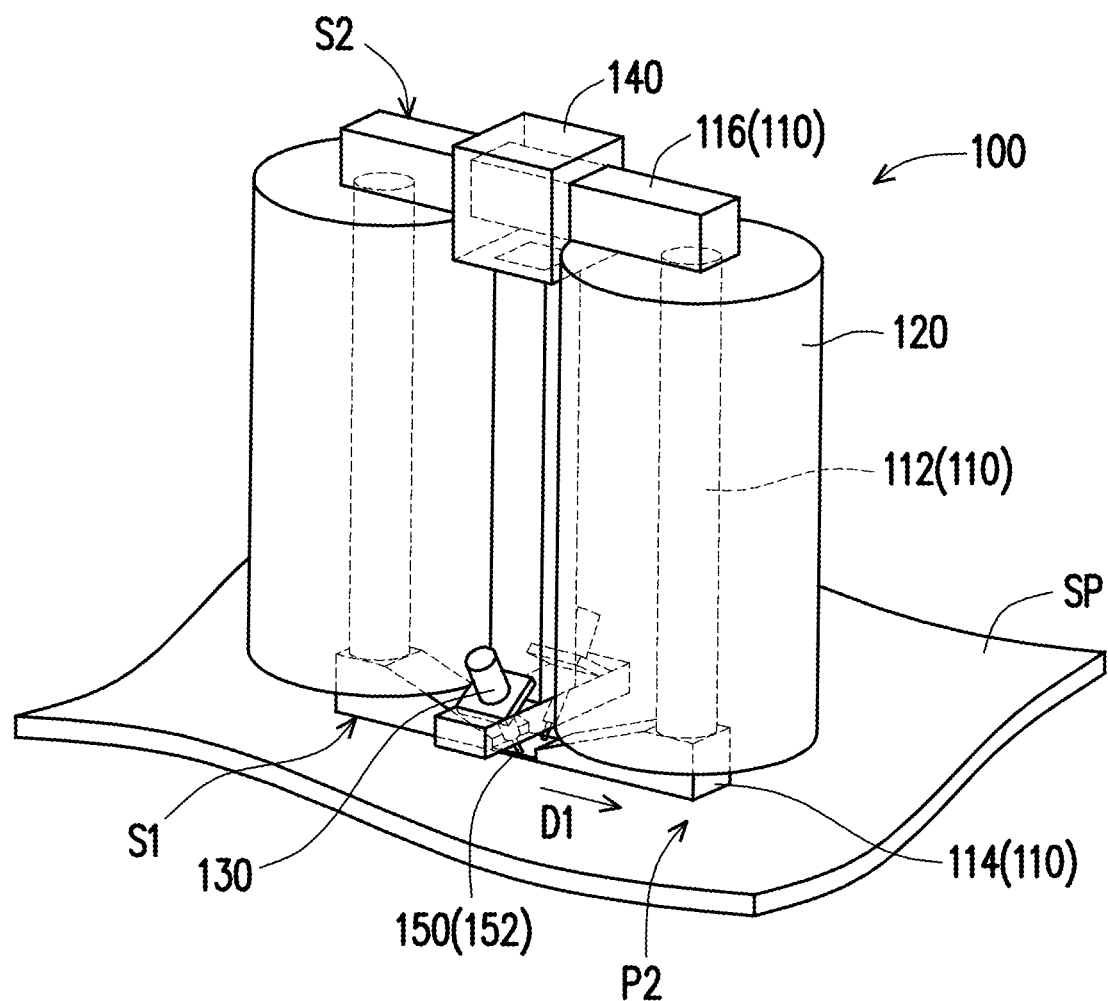
FIG. 1 is a schematic view of an electromagnetic property measuring device according to an embodiment of the disclosure.
Figure 2:
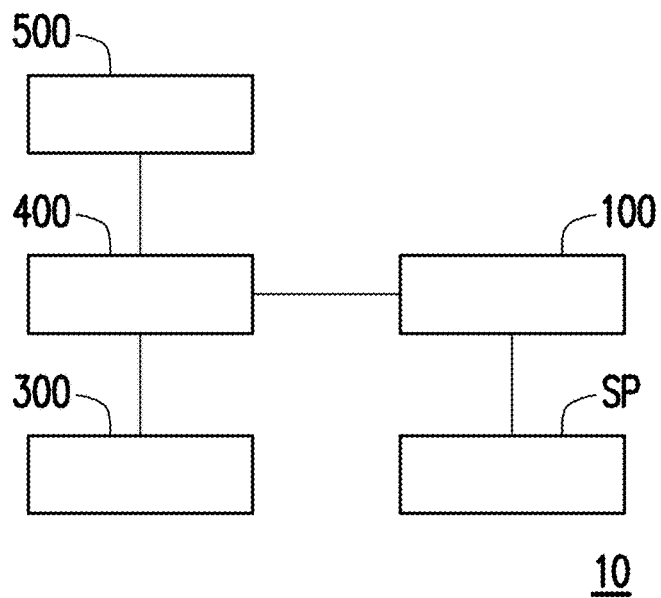
FIG. 2 is a schematic block view of an electromagnetic property measuring system according to an embodiment of the disclosure.

FIG. 1 is a schematic view of an electromagnetic property measuring device according to an embodiment of the disclosure. FIG. 2 is a schematic block view of an electromagnetic property measuring system according to an embodiment of the disclosure. Please refer to FIG. 1 and FIG. 2 together. In some embodiments, an electromagnetic property measuring system 10 includes an electromagnetic property measuring device 100, an analyzing unit 300, a control unit 400, and a power supply unit 500. In some embodiments, the electromagnetic property measuring device 100 is a measuring probe configured to measure electromagnetic properties of a sample SP to be tested and may move freely or in an array-scanning manner on a surface of the sample SP to be tested. The sample SP to be tested in some embodiments is a sheet-like or film-like sample and may have a major surface occupying a large area, which should not be construed as a limitation in the disclosure. As such, the electromagnetic property measuring device 100 provided in the embodiment may move freely on the major surface, so as to measure the sample SP to be tested with the large major surface (occupying a large area). In some embodiments, the electromagnetic property measuring system may further include a moving unit, which may be coupled to the electromagnetic property measuring device 100 to drive the electromagnetic property measuring device 100 to move along the surface of the sample SP to be tested. For instance, the moving unit may be a robotic arm, which may be coupled to the control unit 400 to spontaneously move on the major surface of the sample SP to be tested under the control of the control unit 400, so as to perform measurement of electromagnetic properties on a plurality of measuring points on the surface of the sample SP to be tested. In other embodiments, the electromagnetic property measuring device 100 may also be manually moved on the surface of the sample SP to be tested for measurement by an operator.

In the previous embodiments of the disclosure, the control unit 400 may be coupled to the electromagnetic property measuring device 100, the analyzing unit 300, the power supply unit 500, and a moving unit (if any) and is configured to control the electromagnetic property measuring device 100 and analyzing unit 300 to measure the surface of the sample SP to be tested. For instance, the control unit 400 may include a desktop computer, a server, a portable electronic device, or any other appropriate electronic device, which should however not be construed as a limitation in the disclosure. The power supply unit 500 may be coupled to the electromagnetic property measuring device 100 and the control unit 400, and the power supply unit 500 may be controlled by the control unit 400 and configured to provide a current to the electromagnetic property measuring device 100 to generate a magnetic field.

In some embodiments, the electromagnetic property measuring device 100 may include a magnetic conductive structure 110, a coil 120, and a scattering parameter measuring unit 150. The magnetic conductive structure 110 includes a first side S1 and a second side S2 opposite to each other, wherein the first side S1 is configured to face the sample SP to be tested. The coil 120 surrounds at least part of the magnetic conductive structure 110, so as to generate a magnetic field of a loop current with the magnetic conductive structure 110. In other words, according to the previous embodiments of the disclosure, the current passing through the coil 120 is applied to generate the magnetic field around the coil 120. Generally, the greater the current passing through the coil 120, the greater the resultant magnetic field intensity; the less the current passing through the coil 120, the less the resultant magnetic field intensity. In addition, the more the number of turns of the coil 120, the greater the resultant magnetic field intensity. In some embodiments, the coil 120 may include a single-core metal wire, a multi-core metal wire, a single-layer metal tube, or a multi-layer metal tube, which should however not be construed as a limitation in the disclosure.

In detail, the magnetic conductive structure 110 may include a plurality of magnetic conductive columns 112 (two magnetic conductive columns 112 are shown in the drawings, which should however not be construed as a limitation in the disclosure), a first magnetic conductor 114, and a second magnetic conductor 116. The magnetic conductive columns 112 may be parallel to each other and connected between the first side S1 and the second side S2. The first magnetic conductor 114 is connected to the magnetic conductive column 112 at the first side S1, and the second magnetic conductor 116 is connected to the magnetic conductive column 112 at the second side S2. To be specific, the magnetic conductive columns 112 may be arranged in parallel to each other to define the first side S1 (lower side) and the second side S2 (upper side) of the electromagnetic property measuring device 100, the first magnetic conductor 114 may be disposed below the magnetic conductive column 112 to connect the first side S1 of the magnetic conductive columns 112, respectively, and the second magnetic conductor 116 may be disposed above the magnetic conductive columns 112 to connect the second side S2 of the magnetic conductive columns 112, respectively. The coil 120 may respectively surround the magnetic conductive columns 112. Namely, the coil 120 may be wound to form a hollow portion for accommodating the magnetic conductive columns 112, so that the coil 120 is wound on the magnetic conductive columns 112.

In some embodiments, the magnetic conductive structure 110 may be made of a magnetic material (e.g., ferrite) and may have various shapes. For instance, the material of the magnetic conductive structure 110 may include ferrite compounds, such as nickel zinc (NiZn) or manganese zinc (MnZn), or other soft magnetized ferromagnetic materials with low coercivity, which should however not be construed as a limitation in the disclosure. The coercivity of the magnetic conductive material is also called a coercive force, which refers to a magnetic field intensity required when the magnetic conductive material is magnetized to be magnetically saturated and its magnetization is reduced to zero. Low coercivity means low resistance to demagnetization and low hysteresis loss. Certainly, the previous embodiments serve as examples, and the disclosure is not limited thereto. In addition, in the electromagnetic property measuring device 100, the cylindrical magnetic conductive columns 112 and the coil 120 wound around the magnetic conductive columns 112 shown in the drawings merely serve as one specific embodiment of the disclosure, and any person with general knowledge in the technical field should understand that the magnetic conductive columns 112 of other appropriate shapes may also be applied according to the disclosure.

Figure 3:
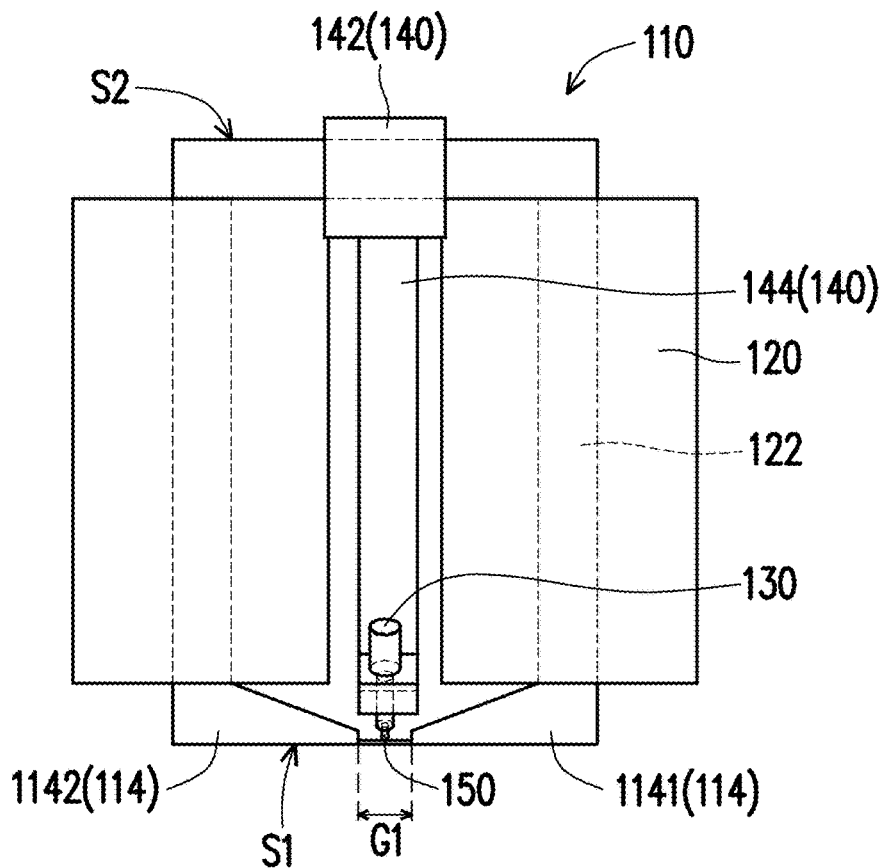
FIG. 3 is a schematic side view of an electromagnetic property measuring device according to an embodiment of the disclosure.
Figure 4:
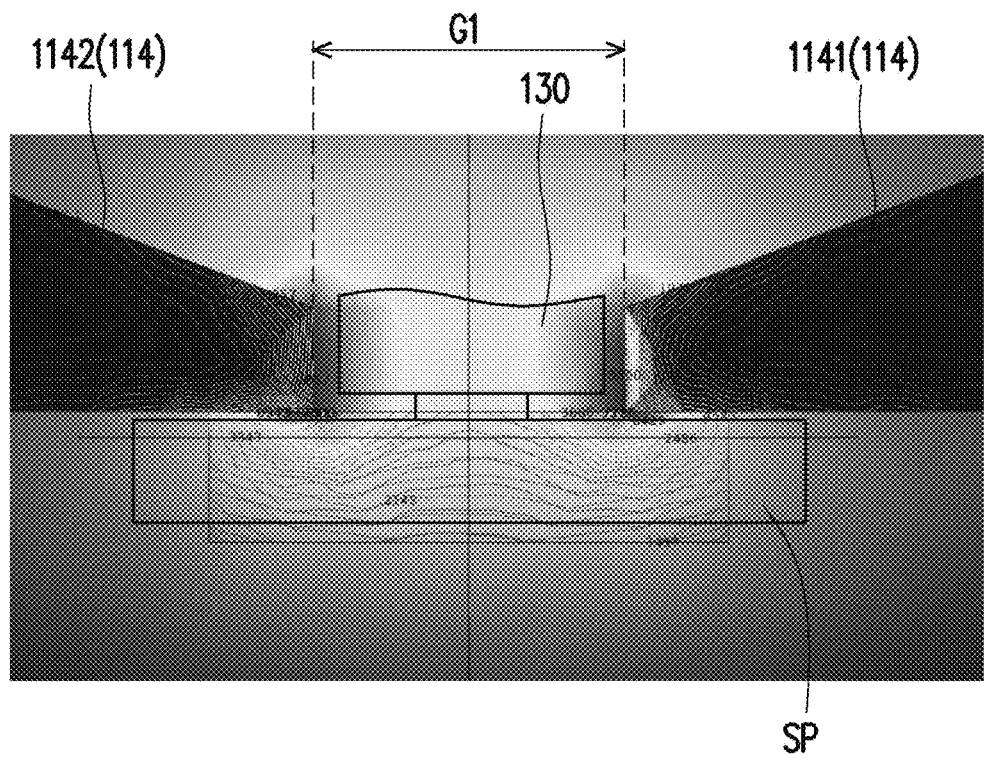
FIG. 4 is a schematic view illustrating measurement conducted by an electromagnetic property measuring device according to an embodiment of the disclosure.
Figure 5:
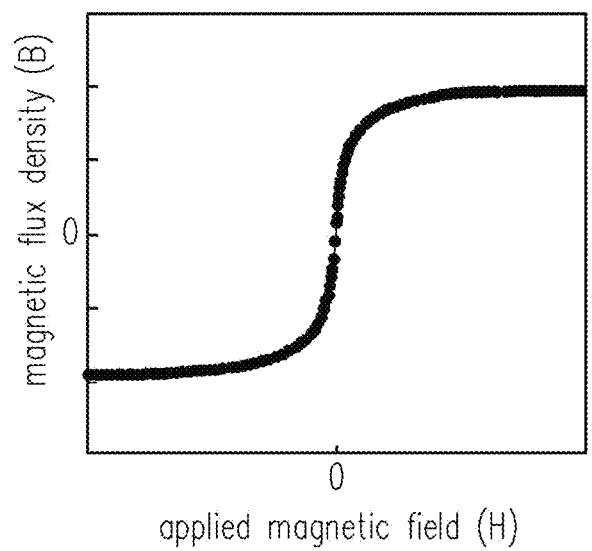
FIG. 5 is a schematic view of a magnetization curve of a magnetic conductive structure according to an embodiment of the disclosure.

FIG. 3 is a schematic side view of an electromagnetic property measuring device according to an embodiment of the disclosure. FIG. 4 is a schematic view illustrating measurement conducted by an electromagnetic property measuring device according to an embodiment of the disclosure. FIG. 5 is a schematic view of a magnetization curve of a magnetic conductive structure according to an embodiment of the disclosure. Please refer to FIG. 3 to FIG. 5 together. Generally, high magnetic permeability of the magnetic conductive material of the magnetic conductive structure 110 of a certain volume leads to high inductance, but the tolerable saturation current of the magnetic conductive structure 110 is low. Once the magnetic saturation is reached, the magnetic permeability value of the magnetic conductive structure 110 may rapidly descend. The so-called magnetic saturation is a property of magnetic materials (such as ferromagnetic materials including iron, nickel, cobalt, manganese, and the alloy thereof or ferrimagnetic materials). Before magnetic saturation (as shown in the left half of the curve in FIG. 5), if an intensity of an applied magnetic field H is increased, the material is magnetized, and a magnetic flux density B may correspondingly increase. However, when the intensity of the applied magnetic field H is greater than a certain level (as shown by the right half of the curve in FIG. 5), the magnetic flux density B may increase slowly due to vacuum magnetic permeability, which is the so-called magnetic saturation. A relationship between the intensity of the applied magnetic field H and the magnetic flux density B may be expressed by the following formula (a) of the magnetic permeability value:

$$\mu = \frac{dB}{dH} \tag{a}$$

Here, μ is the magnetic permeability value. It can be learned from FIG. 5 and the formula (a) of the magnetic permeability value that the magnetic permeability value of materials is not a constant value and is determined according to the intensity of the magnetic field H. The magnetic permeability value of the material characterized by magnetic saturation may reach a maximum value together with the increase in the intensity of the applied magnetic field H and may then decrease together with changes to the saturation and finally approach 1. When μ approaches 1, the magnetic field intensity is defined as a critical magnetic field intensity $H_C$. In some embodiments, the critical magnetic field intensity $H_C$ is greater than or equal to 10 Oersteds (Oe).

In the previous embodiments, the intensity of the applied magnetic field generated by the electromagnetic property measuring device 100 is required to let the magnetic permeability value of the sample SP to be tested approach 1; therefore, the applied magnetic field generated by the electromagnetic property measuring device 100 is required to have sufficient intensity. However, the characteristics of magnetic saturation pose limitations to the maximum magnetic field that may be reached by the magnetic conductive structure 110. In view of the above, the magnetic conductive structure 110 provided in the embodiment has a magnetic gap G1. In an embodiment, the magnetic gap G1 refers to an air gap in a magnetic circuit; that is, the magnetic circuit of the magnetic conductive structure 110 may not be completely closed, and a gap may exist in the magnetic circuit. In some embodiments, the magnetic gap G1 may be filled with a non-magnetic conductive material, such as resin, rubber, ceramics, or any combination thereof, which should however not be construed as a limitation in the disclosure. According to the embodiment, the magnetic gap G1 is arranged in a main magnetic circuit of the magnetic conductive structure (a first magnetic conductor 112 disposed at the first side S1), so as to reduce the magnetic permeability value of the magnetic conductive structure 110, avoid magnetic saturation, and store more energy (most of the energy is stored in the magnetic gap G1).

Specifically, in some embodiments, the first side S1 of the electromagnetic property measuring device 100 has the magnetic gap G1, and the magnetic gap G1 is located above the surface of the sample SP to be tested and between the magnetic conductive columns 112. To be more specific, in the embodiment, the first magnetic conductor 112 connected to the first side S1 of the magnetic conductive columns 112 includes the magnetic gap G1. In other words, the first magnetic conductor 112 may include a plurality of (e.g., two) magnetic conductive parts 1141 and 1142 that are respectively connected to the magnetic conductive columns 112 and extend between the two magnetic conductive columns 112. There may be an interval maintained between the ends of the magnetic conductive parts 1141 and 1142, and the interval is the magnetic gap G1.

Figure 6:
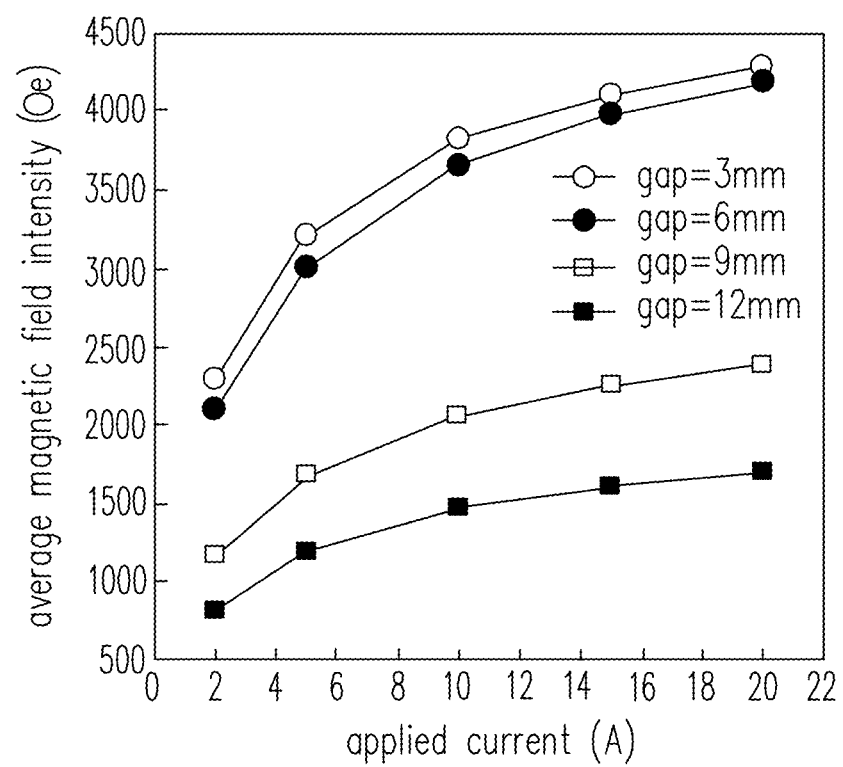
FIG. 6 is a schematic view illustrating a relationship between a current and a magnetic field intensity in an electromagnetic property measuring device according to an embodiment of the disclosure.

FIG. 6 is a schematic view illustrating a relationship between a current and a magnetic field intensity in an electromagnetic property measuring device according to an embodiment of the disclosure. As shown in FIG. 6, the distance (size) of the magnetic gap G1 is closely associated with the resultant magnetic field intensity. Generally, the smaller the distance of the magnetic gap G1, the greater the magnetic field intensity generated by the magnetic conductive structure 110 and the coil 120. For instance, the distance of the magnetic gap G1 may be within a range from 0.1 mm to 12 mm, e.g., about 0.2 mm to 10 mm, about 0.5 mm to 8 mm, about 0.8 mm to 5 mm, about 0.1 mm to 1 mm, about 0.5 mm to 3 mm, about 0.75 mm to 4.5 mm, about 1 mm to 5.5 mm, about 2 mm to 6 mm, about 3 mm to 7 mm, about 4 mm to 8 mm, about 5 mm to 10 mm, about 6 mm to 12 mm, about 1 mm, about 3 mm, about 5 mm, about 6 mm, about 8 mm, about 9 mm, and so on, which should however not be construed as a limitation in the disclosure. Besides, when an additional current is input, the additional current may be controlled to be within a range from 0 ampere (A) to 30 A. For instance, the input current may be 0 A (no current), about 0.01 A to 30 A, about 0.1 A to 25 A, about 0.5 A to 20 A, about 1 A to 18 A, about 2 A to 15 A, about 2 A, about 3 A, about 5 A, about 8 A, about 10 A, about 12 A, about 15 A, about 20 A, about 25 A, and so on, which should however not be construed as a limitation in the disclosure. In the embodiment, the intensity of the applied magnetic field H generated by the electromagnetic property measuring device 100 should be controlled to be substantially between 0 and the critical magnetic field intensity $H_C$. Certainly, the numerical values provided in the embodiment merely serve as examples, and the actual numerical values may vary according to the dimensions of other devices or environmental factors, which should however not be construed as a limitation in the disclosure.

Figure 7:
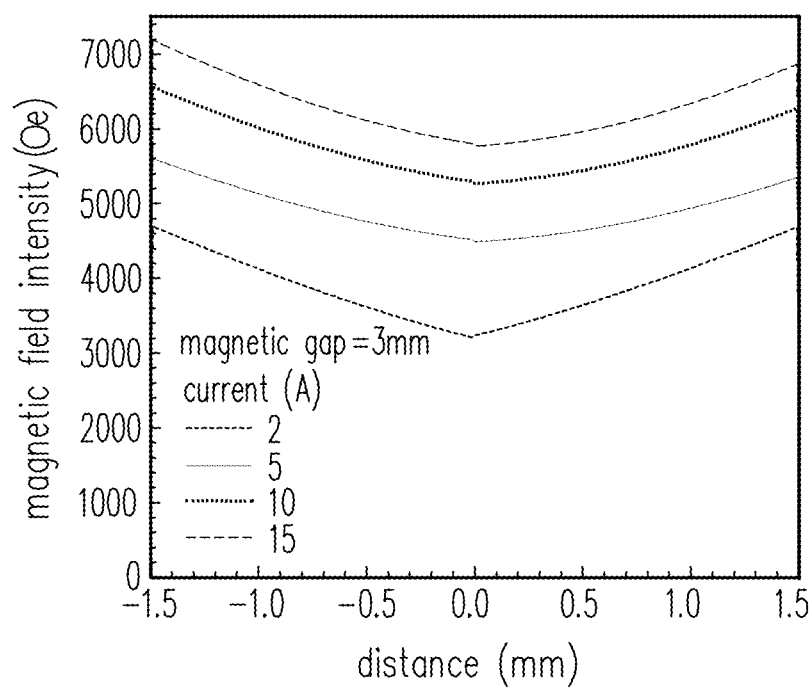
FIG. 7 to FIG. 12 are schematic views illustrating a relationship between a distance of a magnetic gap and a magnetic field intensity in an electromagnetic property measuring device according to an embodiment of the disclosure.
Figure 8:
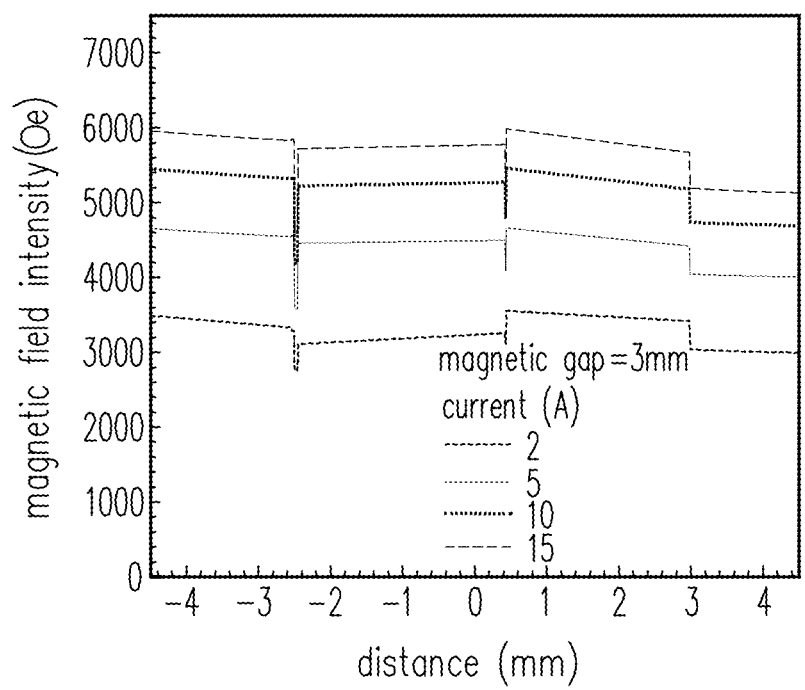
Figure 9:
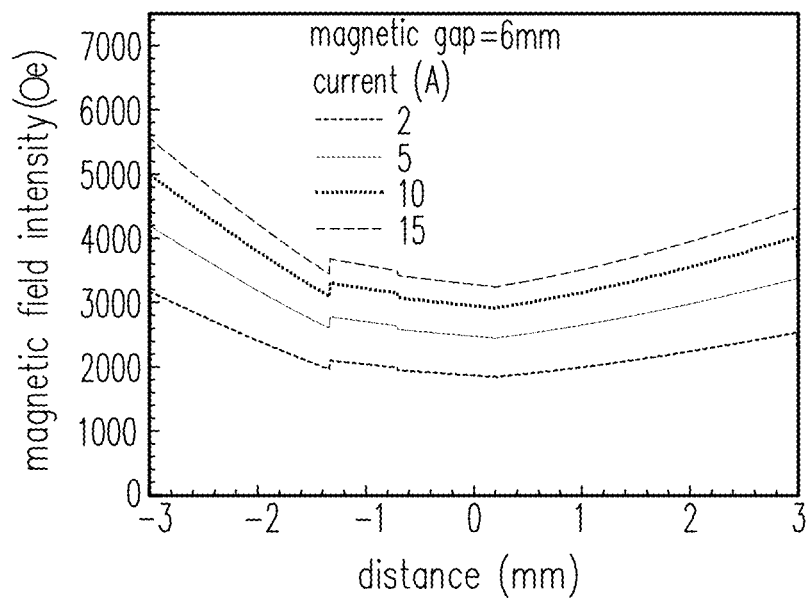
Figure 10:
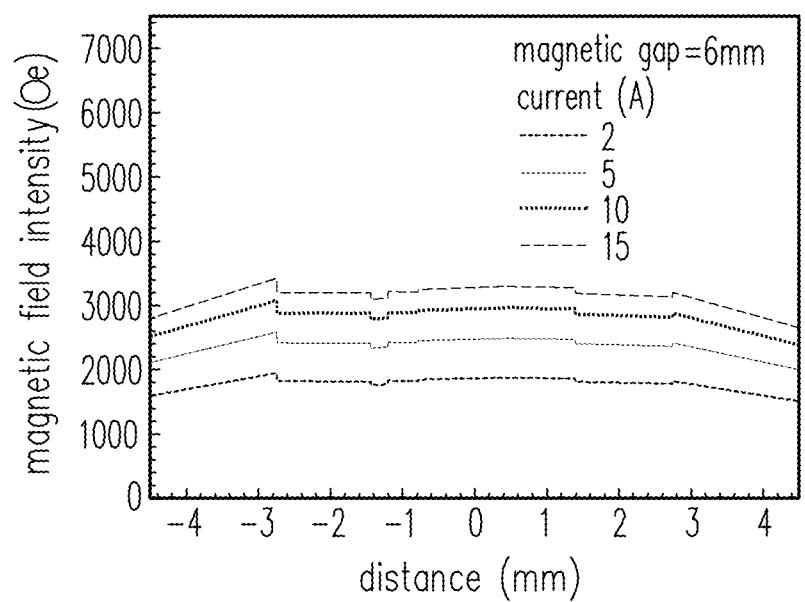
Figure 11:
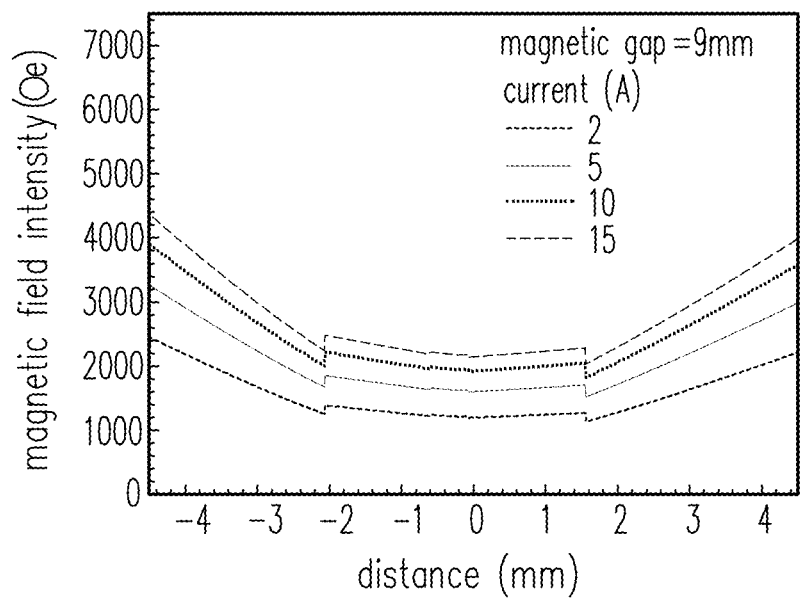
Figure 12:
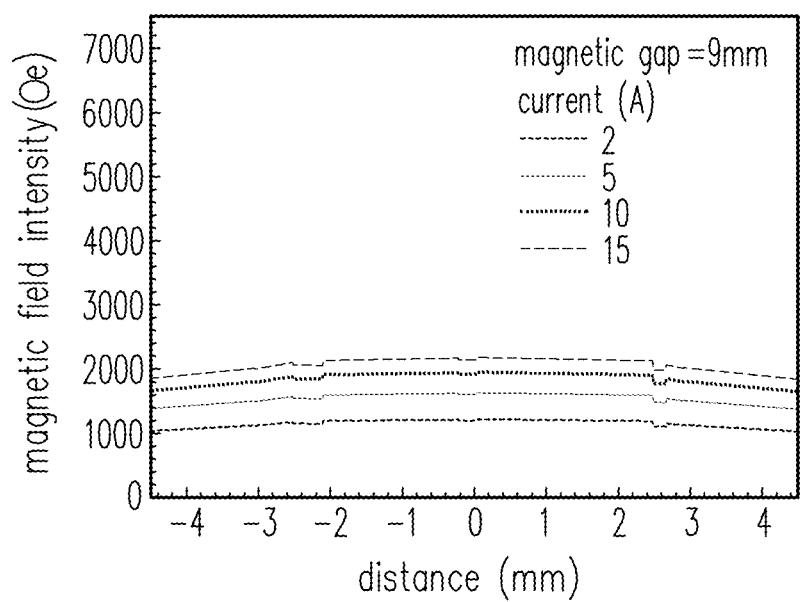

FIG. 7 to FIG. 12 are schematic views illustrating a relationship between a distance of a magnetic gap and a magnetic field intensity in an electromagnetic property measuring device according to an embodiment of the disclosure. Note that FIG. 7 shows the relationship between the magnetic field intensity and the frequency in a direction X (as shown by the direction X in FIG. 13) in the magnetic gap G1 on the condition that different currents (2 A, 5 A, 10 A, 15 A) are input while the distance of the magnetic gap G1 is approximately equal to 3 millimeters (mm). FIG. 8 shows the relationship between the magnetic field intensity and the frequency in a direction Y (as shown by the direction Y in FIG. 13) in the magnetic gap G1 on the condition that different currents (2 A, 5 A, 10 A, 15 A) are input while the distance of the magnetic gap G1 is approximately equal to 3 mm. Similarly, FIG. 9 shows the relationship between the magnetic field intensity and the frequency in the direction X (as shown by the direction X in FIG. 13) in the magnetic gap G1 on the condition that different currents (2 A, 5 A, 10 A, 15 A) are input while the distance of the magnetic gap G1 is approximately equal to 6 mm. FIG. 10 shows the relationship between the magnetic field intensity and the frequency in the direction Y (as shown by the direction Y in FIG. 13) in the magnetic gap G1 on the condition that different currents (2 A, 5 A, 10 A, 15 A) are input while the distance of the magnetic gap G1 is approximately equal to 6 mm. FIG. 11 shows the relationship between the magnetic field intensity and the frequency in the direction X (as shown by the direction X in FIG. 13) in the magnetic gap G1 on the condition that different currents (2 A, 5 A, 10 A, 15 A) are input while the distance of the magnetic gap G1 is approximately equal to 9 mm. FIG. 12 shows the relationship between the magnetic field intensity and the frequency in the direction Y (as shown by the direction Y in FIG. 13) in the magnetic gap G1 on the condition that different currents (2 A, 5 A, 10 A, 15 A) are input while the distance of the magnetic gap G1 is approximately equal to 9 mm.

According to the relationships provided above, it can be learned that the greater the distance of the magnetic gap G1, the less the magnetic field intensity in the magnetic gap G1. However, from the relationships, it can also be found that the distribution of the magnetic field intensity in the magnetic gap G1 increases together with the increase in the current, given that the distance of the magnetic gap G1 remains the same. Therefore, when the magnetic gap G1 is large, it is likely to increase the additional current to comply with the need for the magnetic field intensity.

Please refer to FIG. 1 and FIG. 3. In some embodiments, the scattering parameter measuring unit 150 is disposed at the first side S1 and located within a range of the magnetic field generated by the electromagnetic property measuring device 100, so as to measure the scattering parameter of the sample SP to be tested and accordingly obtain the magnetic permeability value of the sample SP to be tested. Specifically, the electromagnetic property measuring device 100 may further include a bracket 140 arranged at (e.g., fixed to) the second side S2 and extending toward the first side S1 to an upper portion of the magnetic gap G1. Thereby, the scattering parameter measuring unit 150 may be disposed on the bracket 140 (e.g., at an end point of the bracket 140 at the first side S1), so to be located above the magnetic gap G1. In detail, the bracket 140 may include a fixing end 142 and an extension end 144. The fixing end 142 is fixed to the second side S2 of the magnetic conductive structure 110, and the extension end 144 is connected to the fixing end 142 and extends toward the first side S1 to an upper portion of the magnetic gap G1. In an embodiment, the scattering parameter measuring unit 150 may be disposed at an end point of the extension end 144. It may be understood that the position at which the scattering parameter measuring unit 150 is disposed may be changed according to actual needs, which should however not be construed as a limitation in the disclosure. In an embodiment, a material of the bracket 140 may be a non-magnetic conductive material, such as resin, aluminum, copper, and so on, which should however not be construed as a limitation in the disclosure.

According to the structural configurations provided in the previous embodiments, the electromagnetic property measuring device 100 has the magnetic gap G1 at the first side S1, so that the maximum magnetic field may be guided to the first side S1. Accordingly, the first side S1 of the electromagnetic property measuring device 100 faces the sample SP to be tested, and the electromagnetic property measuring device 100 may then move on the surface of the sample SP to be tested for measurement within a large area. Therefore, it is not necessary for the electromagnetic property measuring device 100 provided in the disclosure to cut or trim the sample SP to be tested to a specific size to be accommodated between two magnetic field structures; instead, the electromagnetic property measuring device 100 may move directly on the surface of the sample SP to be tested to measure the sample SP to be tested that remains intact, thus mitigating the impact of shape on the electromagnetic properties. As a result, the electromagnetic property measuring device 100 provided in the disclosure may effectively improve the measurement accuracy of the electromagnetic properties of the sample SP to be tested (especially a sample occupying a large area or a sheet-like sample).

Figure 13:
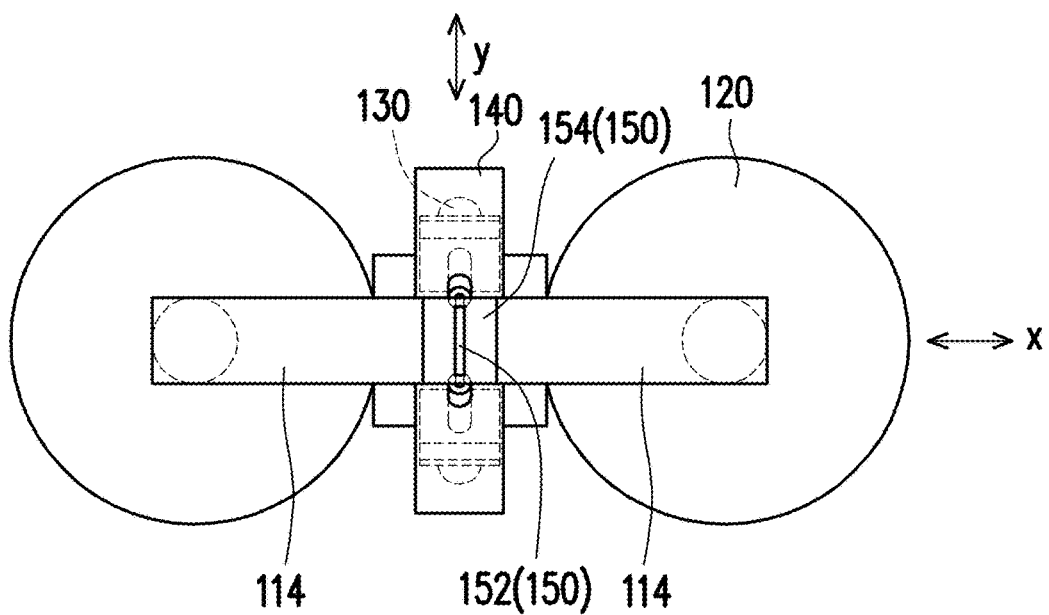
FIG. 13 is a schematic bottom view of an electromagnetic property measuring device according to an embodiment of the disclosure.
Figure 14:
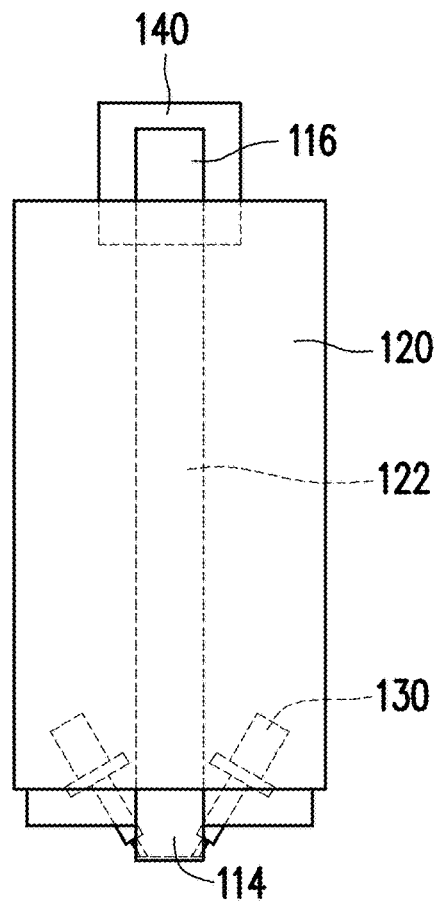
FIG. 14 is a schematic side view at another angle of an electromagnetic property measuring device according to an embodiment of the disclosure.

FIG. 13 is a schematic bottom view of an electromagnetic property measuring device according to an embodiment of the disclosure. FIG. 14 is a schematic side view at another angle of an electromagnetic property measuring device according to an embodiment of the disclosure. Please refer to FIG. 13 and FIG. 14 together. In some embodiments, the scattering parameter measuring unit 150 includes a conductive wire layer 152 and a dielectric layer 154 that overlap each other. Here, the conductive wire layer 152 of the scattering parameter measuring unit 150 closest to the sample SP to be tested includes a microstrip line, a coplanar waveguide (abbreviated as CPW or CPWG), or other strip structures. In an embodiment, the scattering parameter measuring unit 150 measures the scattering parameter by applying the microstrip line, which should certainly not be construed as a limitation in the disclosure. According to an embodiment, a distance between the scattering parameter measuring unit 150 and the first side S1 may be substantially equal to or less than 7.5 cm, e.g., about 7 cm, about 6.5 cm, about 6 cm, about 5.5 cm, about 5 cm, about 4.5 cm, about 4 cm, about 3.5 cm, about 3 cm, about 2.5 cm, about 2 cm, and so on, which should however not be construed as a limitation in the disclosure. Specifically, the microstrip line is a transmission line composed of a conductive wire, a ground end, and a dielectric layer. The analyzing unit 300 may, for instance, be coupled to the scattering parameter measuring unit 150 of the electromagnetic property measuring device 100 to analyze the electromagnetic properties of the sample SP to be tested. For instance, the analyzing unit 300 may include a network analyzer that may be respectively connected to opposite ends of the microstrip line (a conductive wire layer 152) of the scattering parameter measuring unit 150 via a connection port 130.

In some embodiments, a method of measuring the scattering parameter may include measuring a first scattering parameter of the electromagnetic property measuring device 100 by applying the scattering parameter measuring unit 150, measuring a second scattering parameter by applying the scattering parameter measuring unit 150 when the electromagnetic property measuring device 100 is placed on the sample SP to be tested but no magnetic field is applied, and finally measuring a third scattering parameter when the electromagnetic property measuring device 100 is placed on the sample SP to be tested and the magnetic field is applied, whereby the analyzing unit 300 may calculate the electromagnetic properties of the sample SP to be tested according to an equivalent circuit model and the above-mentioned three scattering parameters, e.g., (plural) magnetic permeability values.

Figure 15:
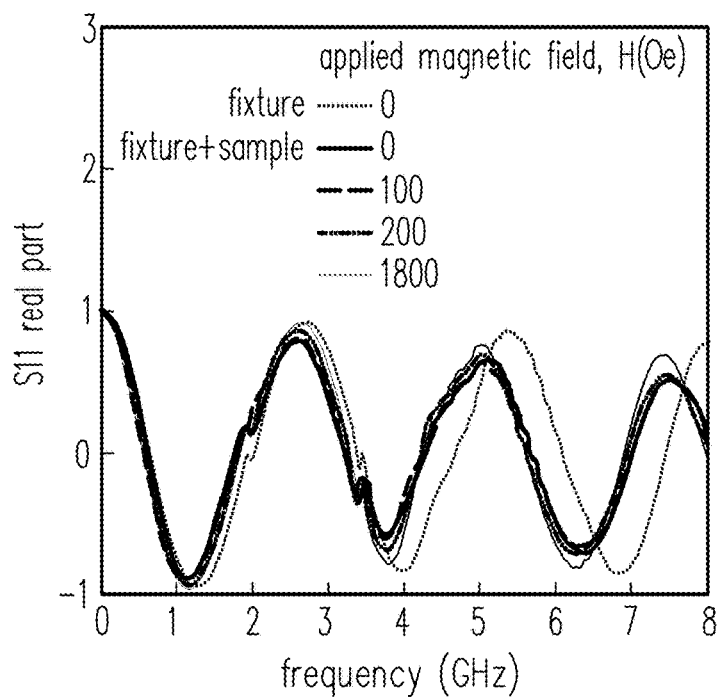
FIG. 15 to FIG. 16 are schematic views illustrating a relationship between a scattering parameter and a frequency obtained by applying an electromagnetic property measuring device under different applied magnetic fields according to an embodiment of the disclosure.
Figure 16:
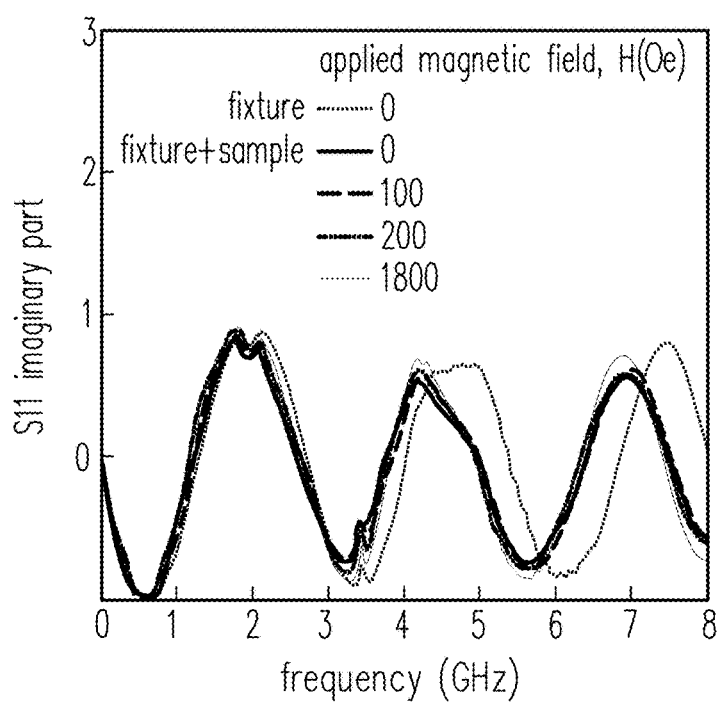
Figure 17:
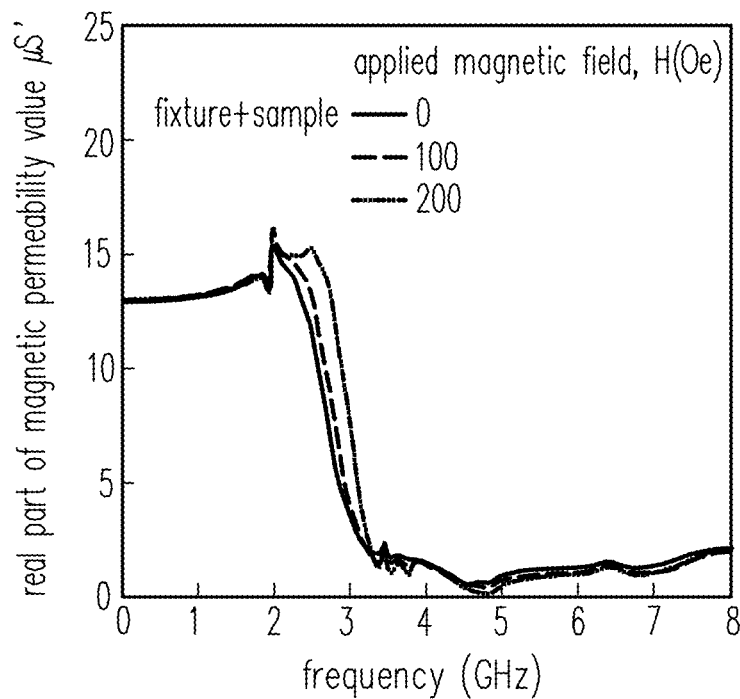
FIG. 17 to FIG. 18 are schematic views illustrating a relationship between a magnetic permeability value and a frequency obtained by applying an electromagnetic property measuring device under different applied magnetic fields according to an embodiment of the disclosure.
Figure 18:
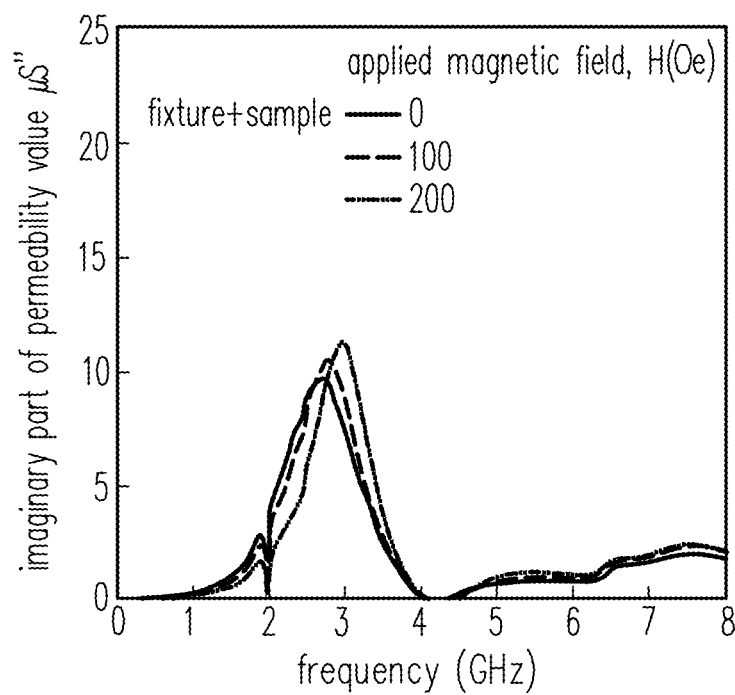

FIG. 15 to FIG. 16 are schematic views illustrating a relationship between a scattering parameter and a frequency obtained by applying an electromagnetic property measuring device under different applied magnetic fields according to an embodiment of the disclosure. FIG. 17 to FIG. 18 are schematic views illustrating a relationship between a magnetic permeability value and a frequency obtained by applying an electromagnetic property measuring device under different applied magnetic fields according to an embodiment of the disclosure. Generally, the real part represents absorption, and the imaginary part represents loss. FIG. 15 shows the relationship between the frequency and the real part of the scattering parameters measured by the scattering parameter measuring unit 150 on five different conditions: there is only the electromagnetic property measuring device 100 itself (marked as "fixture"), the electromagnetic property measuring device 100 is placed on the sample SP to be tested but no magnetic field is applied (marked as "fixture+sample"), the electromagnetic property measuring device 100 is placed on the sample SP to be tested and a magnetic field of 100 Oe is applied (marked as "100"), the electromagnetic property measuring device 100 is placed on the sample SP to be tested and a magnetic field of 200 Oe is applied (marked as "200"), and the electromagnetic property measuring device 100 is placed on the sample SP to be tested and a magnetic field of 1800 Oe is applied (marked as "1800"). Similarly, FIG. 16 shows the relationship between the frequency and the imaginary part of the scattering parameters measured by the scattering parameter measuring unit 150 on said five different conditions.

Next, the electromagnetic properties (e.g., the magnetic permeability value) of the sample SP to be tested may be obtained according to the results mentioned above, so as to learn the relationship between the magnetic permeability values and the frequency obtained by applying the electromagnetic property measuring device as shown in FIG. 17 and FIG. 18 while different magnetic fields are applied. According to FIG. 17 and FIG. 18, it can be learned that the response frequency increases together with the increase of the magnetic field, and thereby it can be seen learned that the sample SP to be tested has the ferromagnetic resonance property.

Figure 19:
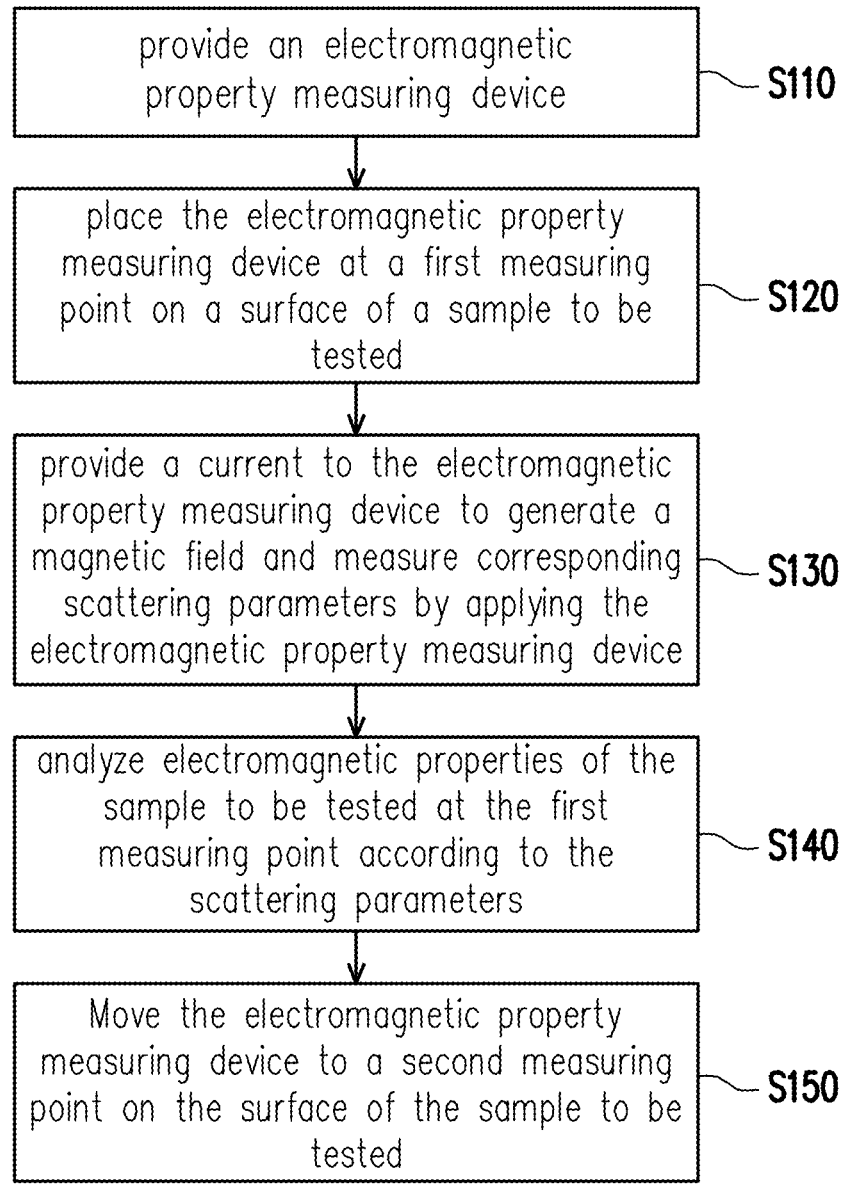
FIG. 19 is a schematic flowchart of an electromagnetic property measuring method according to an embodiment of the disclosure.

FIG. 19 is a schematic flowchart of an electromagnetic property measuring method according to an embodiment of the disclosure. Please refer to FIG. 1 and FIG. 3 together. A method of applying said electromagnetic property measuring device 100 and/or said electromagnetic property measuring system 10 may include following steps. First, step S110 is performed to provide the electromagnetic property measuring system 10 as described above, and the electromagnetic property measuring system 10 includes the electromagnetic property measuring device 100. Next, step S120 is performed to place the electromagnetic property measuring device 100 at a first measuring point P1 on the surface of the sample SP to be tested. In some embodiments, the number of the electromagnetic property measuring device 100 may be plural. That is, in the embodiment, plural electromagnetic property measuring devices 100 may be simultaneously provided to perform the measurement on the surface of the sample SP to be tested.

Next, step S130 is performed to provide a current to the electromagnetic property measuring device 100 to generate a magnetic field, and the corresponding scattering parameters are measured by applying the electromagnetic property measuring device 100. Specifically, the control unit 400 may control the power supply unit 500 to provide the current to the electromagnetic property measuring device 100 to generate a magnetic field. The analyzing unit 300 is configured to measure the scattering parameters at both ends of the microstrip line (the conductive wire layer 152). Then, step S140 is performed to analyze the electromagnetic properties of the sample SP to be tested on the first measuring point P1 according to the scattering parameters. In the present embodiment, the electromagnetic properties may be, for instance, a plurality of magnetic permeability values, which should however not be construed as a limitation in the disclosure.

In detail, during the measurement, the electromagnetic property measuring device 100 is placed on the surface of the sample SP to be tested. At this time, the two ends of the microstrip line (the conductive wire layer 152) of the electromagnetic property measuring device 100 constitute a two-port network; the scattering parameter measuring unit 150 may, for instance, measure the scattering parameters at both ends of the microstrip line through frequency sweeping, calculate characteristic impedance at terminals of the opposite ends of the conductive wire layer 152 (the microstrip line) based on a transmission reflection method, and accordingly calculate the magnetic permeability value of the sample SP to be tested.

To be specific, calculation of the magnetic permeability values of the sample SP to be tested may include following steps. First, when the electromagnetic property measuring device 100 is not placed on the sample SP to be tested, the first scattering parameter of the microstrip line is measured, and thereby the corresponding characteristic impedance at a first terminal is calculated. Next, the electromagnetic property measuring device 100 is placed on the sample SP to be tested, and a considerable amount of the current is applied to the coil 120 to form an additional reinforced magnetic field on the surface of the sample SP to be tested (for instance, the magnetic field may be controlled to be between 0 and the critical magnetic field intensity $H_C$), a second scattering parameter of the microstrip line of the additional reinforced magnetic field on the sample SP to be tested is measured, and thereby the corresponding characteristic impedance at a second terminal is calculated. Next, a third scattering parameter of the microstrip line is measured when the electromagnetic property measuring device 100 is placed on the sample SP to be tested, and thereby the corresponding characteristic impedance at a third terminal is calculated. Finally, based on the above numeral values, the electromagnetic properties (e.g., the magnetic permeability values) of the sample SP to be tested on the first measuring point P1 are analyzed by applying the equivalent circuit extraction model.

After that, the electromagnetic property measuring device 100 may be moved (e.g., along a moving direction D1) to a second measuring point P2 on the surface of the sample SP to be tested for subsequent measurement. The measurement steps subsequently performed may be repeated, e.g., step S130 to step S140 may be repeated until all measuring points on the sample SP to be tested are measured. Redundant or similar technical content will not be further elaborated in the embodiment. In some embodiments, the electromagnetic property measuring device 100 may be manually moved to the second measuring point P2 by the operator, or the electromagnetic property measuring device 100 may be moved to the second measuring point P2 via a movement unit controlled by the control unit 400.

According to some embodiments, a method of moving the electromagnetic property measuring device 100 may include free movement or array scan movement on the surface of the sample SP to be tested. In addition, a method of placing the electromagnetic property measuring device 100 on the measuring points of the sample SP to be tested may include direct contact; that is, the electromagnetic property measuring device 100 may directly contact the surface of the sample SP to be tested. However, in other embodiments, the method of placing the electromagnetic property measuring device 100 on the measuring points of the sample SP to be tested may also be indirect contact; that is, the electromagnetic property measuring device 100 may be spaced from the surface of the sample SP to be tested by a certain distance (e.g., floating on the surface of the sample SP to be tested).

Figure 20:
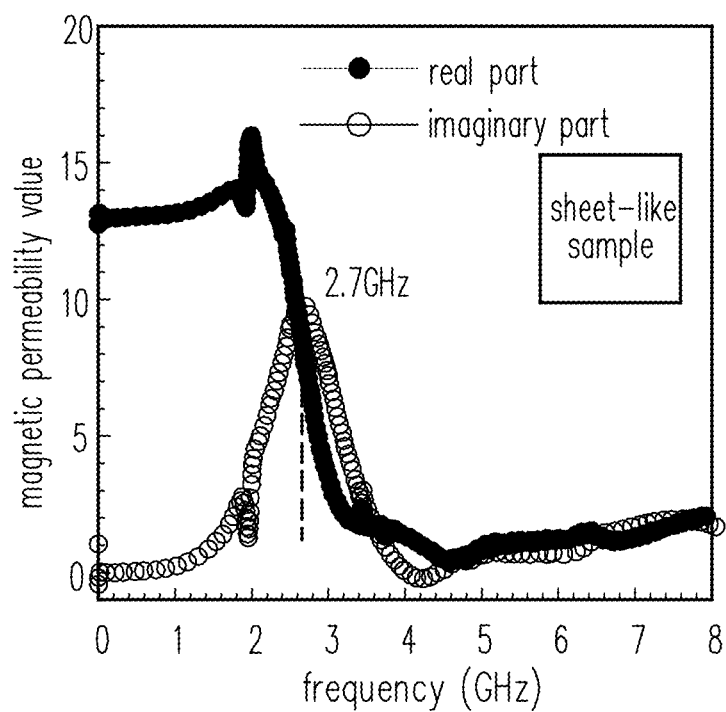
FIG. 20 is a schematic view illustrating a relationship between a magnetic permeability value and a frequency obtained by applying an electromagnetic property measuring device according to an embodiment of the disclosure.
Figure 21:
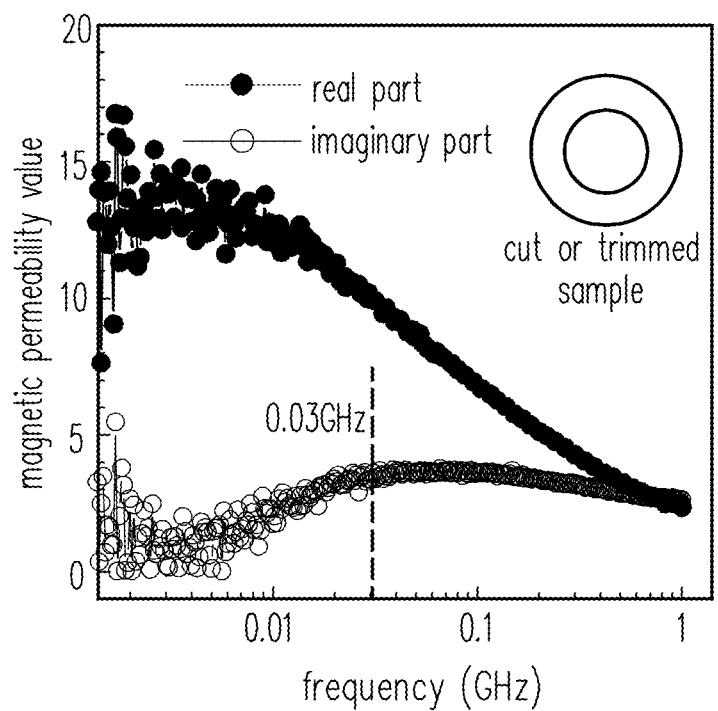
FIG. 21 is a schematic view illustrating a relationship between a magnetic permeability value and a frequency obtained by applying a conventional electromagnetic property measuring device.

FIG. 20 is a schematic view illustrating a relationship between a magnetic permeability value and a frequency obtained by applying an electromagnetic property measuring device according to an embodiment of the disclosure. FIG. 21 is a schematic view illustrating a relationship between a magnetic permeability value and a frequency obtained by applying a conventional electromagnetic property measuring device. Specifically, FIG. 20 and FIG. 21 are schematic diagrams illustrating the relationship between frequencies and different magnetic permeability values obtained by applying the electromagnetic property measuring device 100 provided in the disclosure and a conventional winding method to measure the magnetic permeability values of the sample to be tested. Since the electromagnetic property measuring device 100 provided in the disclosure may move directly on the surface of the original (sheet-like) sample SP to be tested for measurement within a large area, it is not necessary to cut or trim the sample SP to be tested to a specific size (e.g., the trimmed hollow cylindrical shape as shown in FIG. 21) to be accommodated between two magnetic field structures, thus mitigating the impact of shape on the electromagnetic properties. According to the comparison results of FIG. 20 and FIG. 21, it can be learned that the measured magnetic permeability value of the sample to be tested without being cut or trimmed in FIG. 20 is about 12.6 at a frequency of 10 MHz; by contrast, the measured magnetic permeability value of the cut or trimmed sample to be tested in FIG. 21 is about 13.23 at the frequency of 10 MHz, and the difference between the two reaches 7%. In addition, the measured response frequency of the sample to be tested without being cut or trimmed in FIG. 20 is about 2.71 GHz, which is much higher than the measured response frequency of the cut or trimmed sample to be tested in FIG. 21 (about 0.03 GHz), and the above difference should result from the impact of the shape of the sample to be tested. It can therefore be deduced that the electromagnetic property measuring device 100 provided in the disclosure may effectively improve the measurement accuracy and the measurement correction rate of the electromagnetic properties of the sample SP to be tested (especially the sample occupying a large area or the sheet-like sample).

To sum up, the electromagnetic property measuring device provided in the disclosure has the magnetic gap at the first side facing the sample to be tested, so that the magnetic field may be guided to the first side. Accordingly, the first side of the electromagnetic property measuring device faces the sample to be tested and may then move on the surface of the sample to be tested for measurement within a large area. Therefore, it is not necessary for the electromagnetic property measuring device provided in the disclosure to cut or trim the sample to be tested to a specific size to be accommodated between two magnetic field structures; instead, the electromagnetic property measuring device may move directly on the surface of the sample to be tested to measure the sample that remains intact, thus mitigating the impact of shape on the electromagnetic properties. As a result, the electromagnetic property measuring device provided in the disclosure may effectively improve the measurement accuracy of the electromagnetic properties of the sample to be tested (especially the sample occupying a large area or the sheet-like sample).

Although the disclosure has been described and exemplified by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. An electromagnetic property measuring device, comprising:
    a magnetic conductive structure, comprising a first side facing a sample to be tested and a second side opposite to the first side, wherein the first side has a magnetic gap;
    a coil, surrounding the magnetic conductive structure to generate a magnetic field with the magnetic conductive structure; and
    a scattering parameter measuring unit, disposed at the first side and located within a range of the magnetic field.

2. The electromagnetic property measuring device according to claim 1, wherein the electromagnetic property measuring device is configured to move along a surface of the sample to be tested.

3. The electromagnetic property measuring device according to claim 1, wherein the magnetic conductive structure comprises a plurality of magnetic conductive columns parallel to each other and connected to the first side and the second side, a first magnetic conductor connected to the magnetic conductive columns at the first side, and a second magnetic conductor connected to the magnetic conductive columns at the second side, the coil respectively surrounds the magnetic conductive columns, and the first magnetic conductor comprises the magnetic gap.

4. The electromagnetic property measuring device according to claim 1, wherein a current input to the coil is within a range from 0 ampere to 30 amperes.

5. The electromagnetic property measuring device according to claim 1, wherein when a magnetic permeability value of the sample to be tested is substantially equal to 1, a corresponding magnetic field intensity is a critical magnetic field intensity, and a magnetic field intensity generated by the coil and the magnetic conductive structure is substantially within a range from 0 to the critical magnetic field intensity.

6. The electromagnetic property measuring device according to claim 1, wherein a distance of the magnetic gap is substantially within a range from 0.1 mm to 12 mm.

7. The electromagnetic property measuring device according to claim 1, further comprising a bracket disposed at the second side and extending toward the first side to an upper portion of the magnetic gap.

8. The electromagnetic property measuring device according to claim 7, wherein the scattering parameter measuring unit is disposed on the bracket.

9. The electromagnetic property measuring device according to claim 7, wherein a material of the bracket is a non-magnetic conductive material.

10. The electromagnetic property measuring device according to claim 1, wherein the coil comprises a single-core metal wire, a multi-core metal wire, a single-layer metal tube, or a multi-layer metal tube.

11. The electromagnetic property measuring device according to claim 1, wherein the scattering parameter measuring unit comprises a conductive wire layer and a dielectric layer overlapping each other.

12. The electromagnetic property measuring device according to claim 1, wherein a conductive wire layer of the scattering parameter measuring unit close to the sample to be tested comprises a microstrip line or a coplanar waveguide.

13. The electromagnetic property measuring device according to claim 1, wherein a distance between the scattering parameter measuring unit and the first side is substantially equal to or less than 7.5 cm.

14. An electromagnetic property measuring system, comprising:
    the electromagnetic property measuring device according to claim 1;
    an analyzing unit, coupled to the electromagnetic property measuring device to analyze electromagnetic properties of the sample to be tested; and
    a control unit, coupled to the electromagnetic property measuring device and the analyzing unit to control the electromagnetic property measuring device and the analyzing unit to measure the surface of the sample to be tested.

15. The electromagnetic property measuring system according to claim 14, wherein the analyzing unit comprises a network analyzer.

16. The electromagnetic property measuring system according to claim 14, wherein the analyzing unit is connected to both ends of the microstrip line of the scattering parameter measuring unit.

17. An electromagnetic property measuring method, comprising:
    providing the electromagnetic property measuring device according to claim 1;
    placing the electromagnetic property measuring device on a first measuring point on the surface of the sample to be tested;
    supplying a current to the electromagnetic property measuring device to generate a magnetic field, and measuring a corresponding scattering parameter by applying the electromagnetic property measuring device;
    analyzing electromagnetic properties of the sample to be tested on the first measuring point according to the scattering parameter; and
    moving the electromagnetic property measuring device to a second measuring point on the surface.

18. The electromagnetic property measuring method according to claim 17, wherein a method of moving the electromagnetic property measuring device comprises free movement or array scan movement on the surface of the sample to be tested.

19. The electromagnetic property measuring method according to claim 17, wherein a method of placing the electromagnetic property measuring device on the first measuring point comprises direct contact.

20. The electromagnetic property measuring method according to claim 17, wherein a method of placing the electromagnetic property measuring device on the first measuring point comprises indirect contact.

* * * * *